United States Patent [19]

Eickerman et al.

[11] 4,409,501
[45] Oct. 11, 1983

[54] POWER-ON RESET CIRCUIT

[75] Inventors: Curtis L. Eickerman; Arlie A. Ramsey, both of Scottsdale, Ariz.

[73] Assignee: Motorola Inc., Schaumburg, Ill.

[21] Appl. No.: 284,415

[22] Filed: Jul. 20, 1981

[51] Int. Cl.³ ............... H03K 17/22; H03K 17/284; H03K 17/687
[52] U.S. Cl. ............................ 307/594; 307/238.3; 307/246; 307/585; 307/296 R; 377/107
[58] Field of Search ............. 307/592, 594, 595–597, 307/246, 572, 576, 577, 579, 584, 585, 238.3, 296 R; 377/31, 107

[56] References Cited

U.S. PATENT DOCUMENTS

| | | | |
|---|---|---|---|
| 3,775,693 | 11/1973 | Proebsting | 307/304 X |
| 3,895,239 | 7/1975 | Alaspa | 307/594 |
| 3,950,654 | 4/1976 | Broedner et al. | 307/297 X |
| 4,001,609 | 1/1977 | Sickert | 307/296 R X |
| 4,045,688 | 8/1977 | Stewart | 307/296 A X |
| 4,103,187 | 7/1978 | Imamura | 307/296 R X |
| 4,103,190 | 7/1978 | Beutler | 307/251 X |
| 4,135,102 | 1/1979 | Green et al. | 307/251 X |
| 4,365,174 | 12/1982 | Kucharewski | 307/594 |

Primary Examiner—Stanley D. Miller
Assistant Examiner—David R. Hudspeth
Attorney, Agent, or Firm—Eugene A. Parsons

[57] ABSTRACT

A power-on reset circuit in which a first CMOS inverter drives a second CMOS inverter to turn on a third and fourth CMOS inverter. A reset pulse results at the output of the fourth inverter while the third inverter holds a first MOSFET in an off condition and a capacitor is charged through a resistive network comprised of two MOSFETs. When the capacitor is charged past the switching point of the first inverter, the POR pulse is terminated and the first MOSFET is turned on, allowing the capacitor to be charged to the point that no static current flows through the reset circuit because no static current flows through the first inverter.

7 Claims, 2 Drawing Figures 4,409,501

POWER-ON RESET CIRCUIT

FIELD OF THE INVENTION

The present invention relates to power-on reset circuits and more particularly to CMOS power-on reset circuits.

Power-on reset devices are used to bring circuits into a defined initial state when a supply voltage is switched on. Such a device can provide an output pulse for resetting counters, registers and the like during the power-on sequence. Power-on reset circuits commonly comprise a resistance in series with a capacitor between a supply voltage and a common reference point. This arrangement insures that the power-on pulse follows the variation in power supply after a delay. The delay is determined by the time constant of the resistor capacitor combination and the rise time of the supply voltage.

Among the important factors in the selection of a power-on reset circuit for particular applications are low quiescent power consumption and ease of implementation in integrated circuit form.

The preferred embodiment described in U.S. Pat. No. 4,045,688 attempts to achieve these objectives by the use of a first "capacitor connected" MOS transistor as a "protection" capacitor to insure that a transistor in a feedback circuit does not turn on under fast power rise time conditions. The capacitance of the protection transistor must be much greater than the sum of all capacitances between the output and common or the protective capacitance becomes ineffective due to the capacitive voltage division between the points of input, output and common, but the preferred embodiment does not insure that this ratio can be obtained. Also, for very slow power rise times, the use in the preferred embodiment of another "capacitor connected" MOS transistor does not prevent termination of the power-on reset pulse before an adequate pulse is provided to properly reset other circuits.

SUMMARY OF THE INVENTION

Accordingly, it is an object of the present invention to provide a new and improved power-on reset circuit.

It is a further object of the present invention to provide a new and improved power-on reset circuit that is simple and easily capable of implementation in integrated circuit form.

Yet another object of the present invention is to provide a new and improved power-on reset circuit wherein quiescent power consumption is extremely low.

An additional object is to provide a new and improved power-on reset circuit that does not require the use of special "protection" capacitors to handle fast power rise time conditions but that can provide an adequate reset pulse for very slow power rise times.

These and other objects and advantages of this invention will become apparent to those skilled in the art upon consideration of the accompanying specification, claims and drawings.

In order to attain the above mentioned and other objects and advantages, the present invention comprises a means for providing an input signal coupled to the source of a first FET and also to the source of a second FET. The source of a third FET is coupled to the drain and gate of said first FET and to the drain of said second FET. The gate of said third FET is coupled to a source of potential, while the drain of said third FET is coupled to the input of a first inverter and to one electrode of a capacitor, the other electrode of which is connected to said source of potential and to the input of a first inverter. The output of said first inverter is coupled to the input of a second inverter while the output of said second inverter is coupled to inputs of a third and a fourth inverter. The output of said fourth inverter is coupled to the gate of said second FET so that when power is applied to the circuit said first inverter drives said second inverter to drive said fourth inverter to turn off said second FET while a power-on reset signal is produced at the output of said third inverter. When a period determined by the time constant of the RC circuit formed by said first FET, said third FET and said capacitor elapses, the voltage at said input of said first inverter reaches the transition point of said first inverter causing it to drive said second inverter to drive said third inverter to terminate the power-on reset pulse and to drive said fourth inverter to turn on said second FET. When turned on said second FET charges said capacitor to the supply voltage to maintain the state of said first inverter so that no static current is allowed to flow in the circuit.

DESCRIPTION OF A PREFERRED EMBODIMENT

Figure 1:
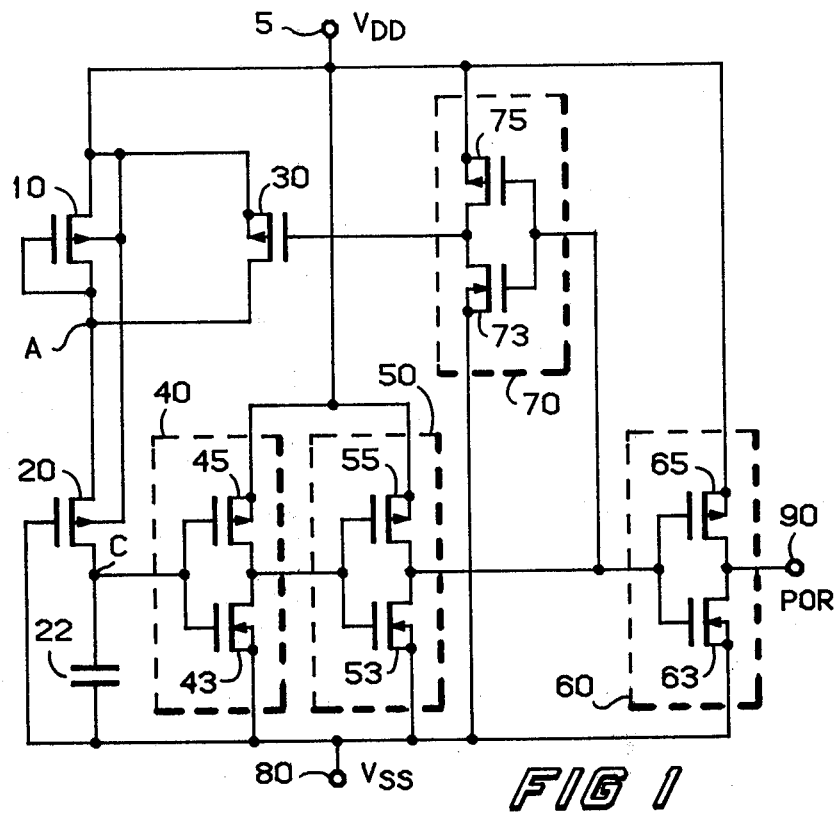
FIG. 1 is a schematic diagram of a device embodying the present invention.

The preferred embodiment schematically illustrated in FIG. 1 in the form in which it could appear on an IC chip, includes $V_{DD}$ conductor 5, $V_{SS}$ conductor 80 which may be at ground, and output POR conductor 90. The source of a P-channel MOSFET 10 and the source of a P-channel MOSFET 30 are connected to conductor 5. The gate and drain of MOSFET 10 and the drain of MOSFET 30 are connected to the source of a P-channel MOSFET 20. The gate of MOSFET 20 is connected to conductor 80, and the drain of MOSFET 20 is connected to one electrode of a capacitor 22, the other electrode of which is connected to conductor 80.

The drain of MOSFET 20 is also connected to the input of an inverter 40. Inverters 40, 50, 60, and 70 are typical CMOS inverters having P-channel MOSFETs 45, 55, 65, and 75, respectively, with their source electrodes connected to conductor 5 and having N-channel MOSFETs 43, 53, 63, and 73, respectively, with their sources connected to conductor 80. In each of the inverters the gate of the P-channel MOSFET and the gate of the N-channel MOSFET are connected to form an input and the drain of the P-channel MOSFET and the drain of the N-channel MOSFET are connected to form an output. The output of inverter 40 is connected to the input of inverter 50, the output of inverter 50 is connected to the input of inverter 60 and to the input of inverter 70, and the output of inverter 70 is connected to the gate of MOSFET 30. The output of inverter 60 is connected to conductor 90.

The two P-channel devices, MOSFETs 10 and 20, along with the gate oxide capacitor 22 and inverter 40 provide the control mechanism for the power-on reset generator. A P-channel MOS device is a voltage controlled gate device that conducts current when the value of the gate electrode to source electrode voltage exceeds the value of the threshold voltage where the bulk to source voltage equals zero, $V_{TOP}$. Where V is the threshold voltage of the P-channel device and $V_{BS}$ is the voltage between the source and substrate, $$V_T = V_{TOP} + \tfrac{1}{2}(V_{BS})^{\tfrac{1}{2}}.$$

Where the source to drain current of the P-channel device is $I_{SD}$, K is a function of processing variables, Z is the width of the channel, L is the length of the channel, and $V_{GS}$ is the gate-to-source voltage, $$I_{SD} = K(Z/L)(V_{GS} - V_T)^2.$$

Solving the source to drain current equation for $V_{GS}$ gives, $$V_{GS} = (I_{SD}/K(Z/L))^{\tfrac{1}{2}} + V_{TOP} + \tfrac{1}{2}(V_{BS})^{\tfrac{1}{2}}.$$

Where $I_{SD}$ is small, about 3 microamps in the preferred embodiment, and Z/L is large, it is approximately true that, $$V_{GS} = V_{TOP} + \tfrac{1}{2}(V_{BS})^{\tfrac{1}{2}}.$$

For MOSFET 10, $V_{BS}$ is equal to zero but for MOSFET 20, where $V_{GS2}$ is the gate to source voltage of MOSFET 20 and where $V_{BS2}$ is the voltage between the source and the substrate for MOSFET 20, $V_{DD}$ is the input voltage, $V_{D1}$ is the drain voltage of MOSFET 10, and the threshold voltage of MOSFET 10 equals $V_{TOP1}$, $$V_{BS2} = V_{DD} - V_{D1} = V_{TOP1}.$$

Therefore, where the value of the threshold voltage where the bulk to source voltage equals zero for MOSFET 20 equals $V_{TOP2}$, $$V_{GS2} = V_{TOP2} + \tfrac{1}{2}(V_{TOP1})^{\tfrac{1}{2}},$$

and for MOSFET 10 and MOSFET 20 to conduct current into capacitor 22, where $V_{GS1}$ is the gate to source voltage of MOSFET 10, and where, as in the preferred embodiment, $$V_{TOP1} = V_{TOP2} = V_{TOP},$$

$$V_{DD} > V_{GS1} + V_{GS2} = 2V_{TOP} + \tfrac{1}{2}(V_{TOP})^{\tfrac{1}{2}}.$$

That is, the input voltage $V_{DD}$ must exceed $$2V_{TOP} + \tfrac{1}{2}(V_{TOP})^{\tfrac{1}{2}}$$

before a charging current is applied to capacitor 22. Therefore, the gate-to-source voltages of MOSFETs 10 and 20 provide a protective barrier or switching level for slow rise time input levels sufficient to provide proper reset action for external circuits.

Because the resistance of a MOS device is a function of the source-to-gate bias and the channel geometry, the geometry of MOSFET 10 and MOSFET 20 can be designed to provide a very high resistance. For very fast rise times, the power-on reset pulse is determined by the charging time of the RC network formed by MOSFETs 10 and 20, and capacitor 22.

Figure 2:
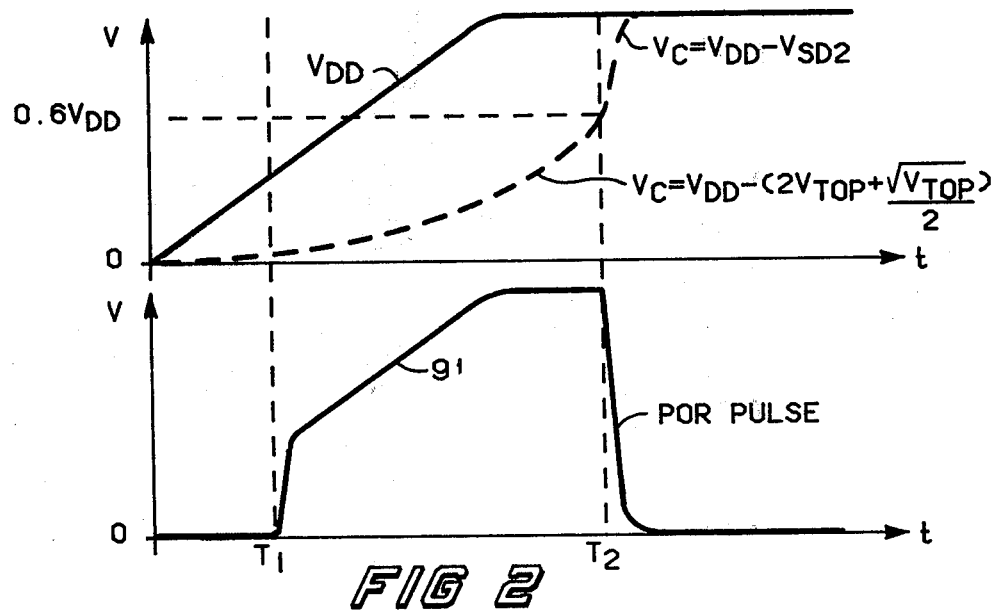
FIG. 2 is a set of representative waveforms present at various points within the preferred embodiment shown by FIG. 1.

Before power is supplied to the circuit, capacitor 22, which can be a gate oxide capacitor in the neighborhood of 10 picofarads, holds the gate of P-channel device 45 low or at ground potential. Therefore, when power is applied and $V_{DD}$ rises, P-channel device 45 begins to conduct first, before P-channel devices 55 and 65. Device 45 then turns on N-channel device 53 while at the same time keeping P-channel device 55 turned off. Device 53 turns on P-channel device 65 so that a power-on reset signal appears at output 90, as shown in FIG. 2 at time $T_1$. As can also been seen in FIG. 2, the rise of the power-on reset pulse 91 follows the rise of $V_{DD}$. Device 53 also holds device 63 in an off condition.

At the same time that device 53 turns on device 65, it also turns on P-channel device 75 and holds off N-channel device 73. In turn, device 75 holds P-channel device 30 in an off condition.

The volage at point C in FIG. 1, indicated as $V_C$ in FIG. 2, rises as capacitor 22 charges through the resistive network formed by devices 10 and 20 toward a voltage level approximately equal to $$V_{DD} - (2V_{TOP} + \tfrac{1}{2}(V_{TOP})^{\tfrac{1}{2}})$$

As $V_C$ continues to increase, N-channel device 43 is turned on because of an increasing gate-to-source voltage, and device 45 is slowly turned off because of a decreasing gate-to-source voltage. The geometry of devices 43 and 45 can be designed in such a manner that a transition or switching point occurs as $V_C$ approaches 60 percent of the input voltage, $V_{DD}$. That is, the resistance of device 43 could be approximately equal to the resistance of device 45 when the input voltage $V_C$ is approximately 0.6 $V_{DD}$. At this voltage level, the output of inverter 40 is switched from a high state, $V_{DD}$, to a low state, $V_{SS}$, turning off device 53, turning on device 55, which in turn turns off device 65 and turns on device 63, terminating the reset pulse.

At this point the voltage across capacitor 22 is at a value equal to $$V_{DD} - (2V_{TOP} + \tfrac{1}{2}(V_{TOP})^{\tfrac{1}{2}})$$

and the P-channel device 45 in inverter 40 is conducting current, and the N-channel 43 device is in saturation. In this condition several micro amperes of current could be dissipated through inverter 40 were it not for the feedback network composed of inverter 70 and P-channel device 30. When device 55 is turned on, it turns off device 75 and turns on device 73, which in turn turns on device 30 to drive drain node A of device 10 to $V_{DD}$. This in turn allows the capacitor voltage to charge toward a level of $V_{DD} - V_{SD2}$, where $V_{SD2}$ is the source to drain voltage of device 20, as indicated in FIG. 2 at time $T_2$. The gate-to-source voltage of device 45 is thereby decreased to a level less than its threshold voltage so that no static current is allowed to flow in inverter 40. Thus the quiescent power consumption of the reset circuit is reduced to a value equal to the product of the supply voltage and the leakage current of the capacitor and the MOS devices.

While the present invention has been described in terms of a preferred embodiment, further modifications and improvements will occur to those skilled in the art. For example, although in the preferred embodiment the geometry of the P-channel and N-channel devices of inverter 40 and 50 are designed in such a manner that a transition or switching point occurs as $V_C$ approaches 60 percent of the input voltage, $V_{DD}$, other switching points such as 45 to 55 percent of $V_{DD}$ have been employed. I desire it to be understood, therefore, that this invention is not limited to the particular form shown and I intend in the appended claims to cover all such equivalent variations which come within the scope of the invention as described.

What is claimed is:

1. A reset circuit, responsive to an applied voltage and having a first and a second voltage terminal, comprising in combination:
    a first FET having a source coupled to said first voltage terminal, said first FET having a gate and having a drain coupled to said gate;
    a second FET having a source coupled to said source of said first FET, said second FET having a gate and a drain, said drain of said second FET being coupled to said drain of said first FET;
    a third FET having a source coupled to said drain of said first FET, a gate coupled to said second voltage terminal, and a drain;
    a capacitor having a first electrode coupled to said drain of said third FET, said capacitor having a second electrode coupled to said second voltage terminal;
    a first inverter having an input coupled to said drain of said third FET and having an output;
    a second inverter having an input coupled to said output of said first inverter and having an output;
    a third inverter having an input coupled to said output of said second inverter and having an output coupled to said gate of said second FET; and
    a fourth inverter having an input coupled to said output of said second inverter and having an output for providing a reset pulse which is the output for the circuit.

2. The circuit as recited in claim 1 wherein said capacitor comprises a gate oxide capacitor.

3. The circuit as recited in claim 1 wherein the circuit is included on an IC chip.

4. The circuit as recited in claim 1 wherein each of said inverters comprises a CMOS inverter having a switching point.

5. The circuit as recited in claim 4 wherein said CMOS inverter circuit in said first inverter has a switching point at between 45% and 60% of the applied voltage.

6. A reset circuit, responsive to an applied voltage and having a first and second voltage terminal, comprising in combination:
    a first FET having a source, a gate, and a drain coupled to said gate;
    a second FET having a source coupled to said drain of said first FET, a gate, and a drain, said gate of said second FET being coupled to said second voltage terminal;
    a capacitor having a first electrode coupled to said drain of said second FET to form a first node, said first FET, said second FET, and said capacitor being connected in series between said first and second voltage terminals;
    a first inverter having an input coupled to said first node and providing an output;
    a second inverter having an input coupled to said output of said first inverter and providing an output;
    a third inverter having an input coupled to said output of said second inverter to form a second node, said third inverter having an output providing a reset pulse which is the output of the circuit; and
    means for providing feedback from said second node to said first electrode of said capacitor to maintain said capacitor at a predetermined voltage level.

7. The circuit as recited in claim 6 wherein said means for providing feedback comprises:
    a fourth inverter having an input coupled to said third node and providing an output; and
    a third enhancement mode FET having a gate coupled to said output of said fourth inverter, a source coupled to said source of said first FET, and a drain coupled to said drain of said first FET.

* * * * *